United States Patent
Yu et al.

(10) Patent No.: US 9,461,075 B2
(45) Date of Patent: Oct. 4, 2016

(54) ARRAY SUBSTRATE AND MANUFACTURING METHOD THEREOF, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Haifeng Yu, Beijing (CN); Haiqin Huang, Beijing (CN); Jiarong Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/762,029

(22) PCT Filed: Nov. 18, 2014

(86) PCT No.: PCT/CN2014/091390
§ 371 (c)(1),
(2) Date: Jul. 20, 2015

(87) PCT Pub. No.: WO2015/192595
PCT Pub. Date: Dec. 23, 2015

(65) Prior Publication Data
US 2016/0254273 A1    Sep. 1, 2016

(30) Foreign Application Priority Data

Jun. 18, 2014  (CN) .......................... 2014 1 0273263

(51) Int. Cl.
*H01L 51/52* (2006.01)
*H01L 27/12* (2006.01)
(Continued)

(52) U.S. Cl.
CPC .......... *H01L 27/124* (2013.01); *G02F 1/1368* (2013.01); *G02F 1/133345* (2013.01); *G02F 1/134309* (2013.01); *G02F 1/136227* (2013.01); *H01L 27/1259* (2013.01)

(58) Field of Classification Search
None
See application file for complete search history.

(56) References Cited

U.S. PATENT DOCUMENTS

2004/0263754 A1    12/2004  Ahn et al.
2006/0138414 A1*   6/2006  Hong ................ G02F 1/133707
                                                         257/59
(Continued)

FOREIGN PATENT DOCUMENTS

CN    101196659 A    6/2008
CN    101334564 A    12/2008
(Continued)

OTHER PUBLICATIONS

International Search Report dated Nov. 18, 2014 corresponding to International application No. PCT/CN2014/091390.
(Continued)

*Primary Examiner* — Michael Lebentritt
(74) *Attorney, Agent, or Firm* — Nath, Goldberg & Meyer; Joshua B. Goldberg

(57) ABSTRACT

The present invention provides an array substrate and a manufacturing method thereof, and a display device, which can solve the problem of RC signal delay caused by large resistance of the common electrode. The array substrate comprises a pixel electrode, a common electrode provided above the pixel electrode, and a common electrode line electrically connected to the common electrode, the pixel electrode and the common electrode are insulated from each other, the array substrate further comprises a first resistance wire layer provided on and in contact with the common electrode line; and a second resistance wire layer provided above and insulated from the first resistance wire layer, the second resistance wire layer is electrically connected to the common electrode line through a via hole penetrating through the first resistance wire layer and an insulation layer provided between the first resistance wire layer and the second resistance wire layer.

12 Claims, 2 Drawing Sheets

(51) Int. Cl.
*G02F 1/1368* (2006.01)
*G02F 1/1343* (2006.01)
*G02F 1/1333* (2006.01)
*G02F 1/1362* (2006.01)

(56) References Cited

U.S. PATENT DOCUMENTS

| | | | | |
|---|---|---|---|---|
| 2007/0002084 A1* | 1/2007 | Kimura | ................ | G09G 3/3241 345/694 |
| 2007/0002246 A1 | 1/2007 | Chang et al. | | |
| 2008/0221346 A1* | 9/2008 | Miyakawa | ............ | C23C 14/044 556/450 |
| 2009/0161056 A1* | 6/2009 | Kil | .................... | G02F 1/136286 349/149 |
| 2009/0261334 A1 | 10/2009 | Ahn | | |
| 2010/0176394 A1* | 7/2010 | Park | .................... | H01L 29/7869 257/43 |
| 2011/0084267 A1* | 4/2011 | Yamazaki | ......... | H01L 21/76828 257/43 |
| 2012/0001156 A1* | 1/2012 | Cho | .................... | H01L 27/1248 257/40 |
| 2012/0315715 A1* | 12/2012 | Cho | ..................... | G02F 1/1368 438/30 |
| 2013/0037818 A1* | 2/2013 | Lee | .................... | H01L 27/3258 257/72 |
| 2013/0260568 A1* | 10/2013 | Hwang | ............... | H01L 27/1288 438/736 |
| 2015/0017753 A1* | 1/2015 | Bae | ......................... | H01L 51/56 438/46 |
| 2015/0162358 A1* | 6/2015 | Inoue | .................. | H01L 27/1225 257/43 |
| 2016/0189650 A1* | 6/2016 | Lee | ...................... | G09G 3/3648 345/690 |

FOREIGN PATENT DOCUMENTS

| | | |
|---|---|---|
| CN | 101414082 A | 4/2009 |
| CN | 101706633 A | 5/2010 |
| CN | 103135300 A | 6/2013 |
| CN | 104090401 A | 10/2014 |
| JP | 2003121874 A | 4/2003 |
| TW | 200700807 A | 9/1998 |

OTHER PUBLICATIONS

Written Opinion of the International Searching Authority dated Nov. 18, 2014 corresponding to International application No. PCT/CN2014/091390.

1st office action issued in corresponding Chinese application No. 201410273263.X dated Apr. 5, 2016.

* cited by examiner

ARRAY SUBSTRATE AND MANUFACTURING METHOD THEREOF, AND DISPLAY DEVICE

This is a National Phase Application filed under 35 U.S.C. 371 as a national stage of PCT/CN2014/091390 filed on Nov. 18, 2014, an application claiming the benefit of Chinese application No. 201410273263.X filed on Jun. 18, 2014; the content of each of which is hereby incorporated by reference in its entirety.

FIELD OF THE INVENTION

The present invention relates to the field of display technology, and particularly to an array substrate and a manufacturing method thereof, and a display device.

BACKGROUND OF THE INVENTION

A Thin Film Transistor Liquid Crystal Display (TFT-LCD for short) is an important panel display apparatus, which is divided into a vertical electric field type and a horizontal electric field type according to direction of the electric field for driving the liquid crystal. In the vertical electric field type TFT-LCD, it is required to form pixel electrodes on an array substrate and form common electrodes on a color filter substrate, which is, for example, in a TN mode. In the horizontal electric field type TFT-LCD, it is required to form pixel electrodes and common electrodes on an array substrate simultaneously. Current horizontal electric field type display technology may improve the image quality of TFT-LCD product, and has advantages of high resolution, high transmittance, low power consumption, wide view angle, high aperture ratio, low chromatism and no push Mura etc.

An existing array substrate primarily comprises thin film transistors, gate lines, data lines, pixel electrodes and common electrodes. Description will be made below with respect to an array substrate comprising bottom-gate type thin film transistors.

As shown in FIG. 1, the array substrate comprises: a gate 2, a gate line, and a common electrode line, which are in the same layer and made of the same material, formed on a base 1; a gate insulation layer 3 formed on the gate 2, the gate line and the common electrode line; an active layer 4 formed on the gate insulation layer 3; a source 5-1, a drain 5-2 and a data line (not shown), which are in the same layer and made of the same material, formed on the active layer 4; a planarization layer formed on the source 5-1, the drain 5-2 and the data line, a plate-shaped pixel electrode 6 formed on the planarization layer and connected to the drain 5-2 through a first via hole penetrating through the planarization layer; a passivation layer formed on the pixel electrode 6; a slit-shaped common electrode 8, which is connected to the common electrode line through a second via hole penetrating through the passivation layer, the planarization layer and the gate insulation layer formed on the passivation layer, formed on the passivation layer. The gate 2, the source 5-1 and the drain 5-2 of the thin film transistor are made of metal, and the pixel electrode 6 and the common electrode 8 are made of indium tin oxide (ITO) which is transparent and conductive.

The inventor finds from the above structure that the array substrate in the prior art at least has following problems: since the resistance of the common electrode line itself is large, when a voltage is applied to the common electrode through the common electrode line, a RC signal delay may be caused, and an IR drop may occur in the common electrode line; meanwhile, since the common electrode line overlaps the data line, a large coupling capacitance is inevitable, so that load on the common electrode may be increased, leading to large fluctuation on the common electrode, and serious greenish may be caused.

SUMMARY OF THE INVENTION

To solve the above problems in the existing array substrate, the present invention provides an array substrate and a manufacturing method thereof, and a display device, which can alleviate signal delay and distortion caused by large resistance of the common electrode line.

An embodiment of the technical solution for solving the above problems includes an array substrate, comprising a pixel electrode, a common electrode provided above the pixel electrode, and a common electrode line electrically connected to the common electrode, wherein the pixel electrode and the common electrode are insulated from each other, and wherein the array substrate further comprises a first resistance wire layer, and a second resistance wire layer which is provided above the first resistance wire layer and is insulated from the first resistance wire layer, the first resistance wire layer is provided on and in contact with the common electrode line;

the second resistance wire layer is electrically connected to the common electrode line through a via hole penetrating through the first resistance wire layer and an insulation layer provided between the first resistance wire layer and the second resistance wire layer.

The structure in which the common electrode line, the first resistance wire layer and the second resistance wire layer in the array substrate of the embodiment in the present invention are connected in parallel is substantially equivalent to the structure of the common electrode line in the prior art. Assuming that the common electrode line, the first resistance wire layer and the second resistance wire layer are equivalent to resistances R1, R2, R3, respectively, and a sum of the resistances of the common electrode line, the first resistance wire layer and the second resistance wire layer is R4, in this case, the resistances R1, R2, R3 are connected in parallel, therefore, it can be known from the formula of parallel resistances that $1/R4=1/R1+1/R2+1/R3$, so that R4 is smaller than any one of R1, R2 and R3. That is to say, arrangement of the common electrode line, the first resistance wire layer and the second resistance wire layer in this embodiment can be considered to reduce the resistance of the common electrode line, and therefore, the RC delay can be effectively alleviated.

Preferably, the first resistance wire layer and the pixel electrode are provided in the same layer, spaced apart from each other, and made of the same material.

Preferably, the second resistance wire layer and the common electrode are provided in the same layer and made of the same material, and wherein the second resistance wire layer is electrically connected to the common electrode.

Preferably, the array substrate further comprises a thin film transistor, a source and a drain of the thin film transistor and the data line are provided in the same layer, and the data line is connected to the source, the data line and the common electrode line are provided in the same layer to be parallel to each other.

Further preferably, the source and the drain of the thin film transistor, the data line and the common electrode line are made of the same material.

An embodiment of the technical solution for solving the above problems includes a manufacturing method of an array substrate, wherein the array substrate is the above array substrate, the manufacturing method comprising:

forming a pattern including a common electrode line on a base through a patterning process;

forming a pattern including a first resistance wire layer in contact with the common electrode line on the base subjected to the above step through a patterning process;

forming an insulation layer on the base subjected to the above step;

forming a via hole penetrating through the insulation layer and the first resistance wire layer on the base subjected to the above step through a patterning process; and forming a pattern including a second resistance wire layer on the base subjected to the above step through a patterning process, so that the second resistance wire layer is connected to the common electrode line through the via hole.

Preferably, the manufacturing method further comprises a step of forming a pattern including a pixel electrode while forming the pattern including the first resistance wire layer in contact with the common electrode line, wherein the pixel electrode and the first resistance wire layer are spaced apart from each other.

Preferably, the manufacturing method further comprises a step of forming a pattern including a common electrode while forming the pattern including the second resistance wire layer, wherein the common electrode is connected to the second resistance wire layer.

Preferably, the manufacturing method further comprises a step of forming a source and a drain of a thin film transistor and a data line while forming the pattern including the common electrode line on the base through the patterning process, wherein the data line is connected to the source, and the data line is parallel to the common electrode line.

An embodiment of the technical solution for solving the above problems further includes a display device comprising the array substrate.

REFERENCE NUMERALS

1—base; 2—gate; 3—gate insulation layer; 4—active layer; 5-1—source; 5-2—drain; 6—pixel electrode; 7—insulation layer; 8—common electrode; 9—first resistance wire layer; 10—data line; 11—second resistance wire layer; and 12—common electrode line.

DETAILED DESCRIPTION OF THE EMBODIMENTS

To make a person skilled in the art better understand the solutions of the present invention, the present invention will be described in detail below in conjunction with the drawings and implementations.

First Embodiment

Figure 2:
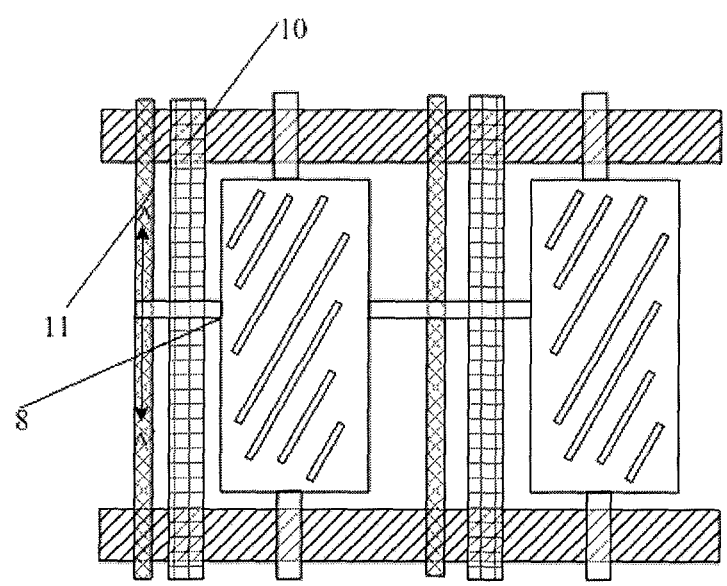
FIG. 2 is a plan diagram of an array substrate in a first embodiment of the present invention.
Figure 3:
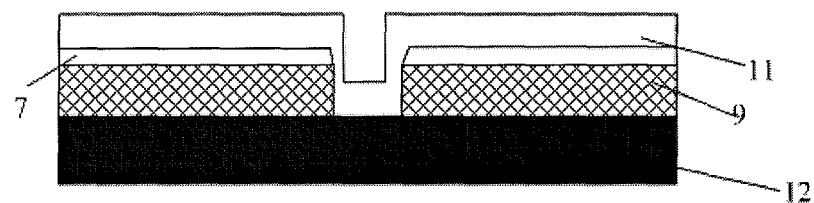
FIG. 3 is a cross-sectional diagram of the array substrate in FIG. 2 taken along line A-A'.

With reference to FIG. 2 and FIG. 3, this embodiment provides an array substrate, comprising a common electrode 8 and a pixel electrode (not shown) below the common electrode 8, wherein the common electrode 8 is electrically connected to a common electrode line 12, and the pixel electrode and the common electrode 8 are insulated from each other. The array substrate further comprises a first resistance wire layer 9, and a second resistance wire layer 11 which is provided above the first resistance wire layer 9 and is insulated from the first resistance wire layer 9, the first resistance wire layer 9 is provided on and in contact with the common electrode line 12; the second resistance wire layer 11 is electrically connected to the common electrode line 12 through a via hole penetrating through the first resistance wire layer 9 and an insulation layer 7 provided between the first resistance wire layer 9 and the second resistance wire layer 11.

It should be noted that, the common electrode 8 in this embodiment is a slit-shaped electrode and the pixel electrode is a plate-shaped electrode. Alternatively, the common electrode 8 is a slit-shaped electrode and the pixel electrode is also a slit-shaped electrode, in this case, the common electrode 8 at least partially un-overlaps the pixel electrode. It should be noted that the embodiment of the present invention is not limited to the array substrate in this display mode, but may be applied to other array substrates in other display modes having the same problems.

In the array substrate of this embodiment, the common electrode line 12, the first resistance wire layer 9 and the second resistance wire layer 11 are electrically connected in parallel, assuming that the common electrode line 12, the first resistance wire layer 9 and the second resistance wire layer 11 are equivalent to resistances R1, R2, R3 respectively, and a sum of the resistances of the common electrode line 12, the first resistance wire layer 9 and the second resistance wire layer 11 is R4, in this case, the resistances R1, R2, R3 are connected in parallel, therefore, it can be known from the formula of parallel resistances that $1/R4=1/R1+1/R2+1/R3$, so that R4 is smaller than any one of R1, R2 and R3. That is to say, arrangement of the common electrode line 12, the first resistance wire layer 9 and the second resistance wire layer 12 in this embodiment can be considered to reduce the resistance of the common electrode line 12, therefore, the RC delay can be effectively alleviated.

In this embodiment, preferably, the first resistance wire layer 9 and the pixel electrode 6 are provided in the same layer, spaced apart from each other, and made of the same material. The pixel electrode 6 and the first resistance wire layer 9 may be thin film including elements such as indium (In), gallium (Ga), zinc (Zn), oxygen (O), tin (Sn) and the like formed by sputtering, wherein the thin film must contain oxygen and other two or more of above elements, such as indium gallium zinc oxide (IGZO), indium zinc oxide (IZO), indium tin oxide (InSnO), indium gallium tin oxide (In-GaSnO) and the like. Since the first resistance wire layer 9 and the pixel electrode 6 are provided in the same layer and made of the same material, a pattern including the first resistance wire layer 9 and the pixel electrode 6 can be formed through a single patterning process, thus no additional process step is added. Certainly, the pixel electrode 6 and the first resistance wire layer 9 may be formed respectively by two patterning processes.

In this embodiment, preferably, the second resistance wire layer 11 and the common electrode 8 are provided in the same layer and made of the same material, wherein the second resistance wire layer 11 is electrically connected to the common electrode 8. The second resistance wire layer 11 and the common electrode 8 may thin film including elements such as indium (In), gallium (Ga), zinc (Zn), oxygen (O), tin (Sn) and the like formed by sputtering, wherein the thin film must contain oxygen and other two or more of above elements, such as indium gallium zinc oxide (IGZO), indium zinc oxide (IZO), indium tin oxide (InSnO), indium gallium tin oxide (InGaSnO) and the like. Since the second resistance wire layer 11 and the common electrode 8 are provided in the same layer and made of the same material, a pattern including the second resistance wire layer 11 and the common electrode 8 can be formed through a single patterning process, thus no additional process step is added. Certainly, the second resistance wire layer 11 and the common electrode 8 may be formed respectively by two patterning processes.

Figure 1:
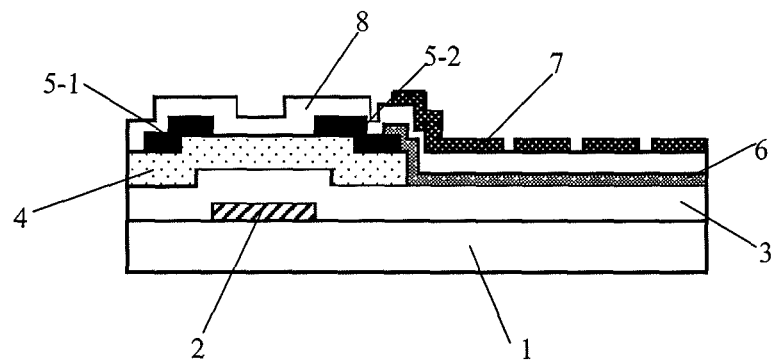
FIG. 1 is a structural diagram of an array substrate in the prior art.

The array substrate in this embodiment preferably further comprises thin film transistors, and a structure of the array substrate will be specifically described below by taking a bottom-gate type transistor as an example. Since a partially structural view of the array substrate in this embodiment is substantially the same as that of the array substrate in the prior art described with reference to FIG. 1, therefore, the description of this embodiment will be made also with reference to FIG. 1. The array substrate in this embodiment sequentially comprises a gate 2, a gate insulation layer 3, an active layer 4, a source 5-1 and a drain 5-2 above the active layer 4 of the thin film transistor, a data line 10 and a common electrode line 12 provided on the base 1, wherein the source 5-1, the drain 5-2 and the data line 10 are provided in the same layer, and the data line 10 is connected to the source 5-1, and the data line 10 and the common electrode line 12 are provided in the same layer and are parallel to each other. Since the data line 10 and the common electrode line 12 are provided in the same layer and are parallel to each other, storage capacitance due to overlapping of the data line 10 and the common electrode line 12 in the prior art can be prevented from generating, thus load on the common electrode 8 can be effectively reduced, and greenish caused by fluctuation on the common electrode 8 can be alleviated.

Further preferably, the source 5-1 and the drain 5-2 of the thin film transistor, the data line 10 and the common electrode line 12 may be made of the same material. The source 5-1 and the drain 5-2 may be made of one or more of molybdenum (Mo), molybdenum niobium alloy (MoNb), aluminum (Al), aluminum neodymium alloy (AlNd), titanium (Ti) and copper (Cu), and Mo, Al or alloy containing Mo, Al are preferable. Since the source 5-1 and the drain 5-2 of the thin film transistor, the data line 10 and the common electrode line 12 are provided in the same layer and made of the same material, therefore, the source 5-1 and the drain 5-2, the data line 10 and the common electrode line 12 may be formed through a single patterning process, and no additional process step is added.

Second Embodiment

This embodiment provides a manufacturing method of an array substrate, and will be described by taking a manufacturing method of an array substrate in the ADvanced super dimension Switch (ADS) mode as an example. The manufacturing method specifically comprises:

step 1, depositing a gate metal layer film on a base 1 by magnetron sputtering method, and then forming a pattern of a gate metal layer including a gate 2 of a thin film transistor and a gate line through a patterning process.

It should be noted that, the base 1 may refer to a substrate without any film layer formed thereon, such as a white glass, or a substrate with other film layer or pattern formed thereon, such as a substrate with a buffer layer formed thereon. The patterning process usually includes photoresist coating, exposure, development, etching, photoresist peeling off etc. In the above step 1, the gate metal layer film is first formed, and photoresist is coated so as to cover the gate metal layer film; exposure is performed by using a mask plate so as to form a exposure region and a non exposure region; development is performed so as to remove the photoresist (such as positive photoresist) in the exposure region, and make the photoresist in the non exposure region remained; the gate metal layer film is etched, wherein the gate metal layer film in the non exposure region is not etched away because of the protection of the photoresist, and finally the photoresist is peeled off so as to form the pattern of the gate metal layer including the gate 2 of the thin film transistor and the gate line.

The gate metal layer film may be a mono-layered structure or a multi-layered composite lamination structure made of one or more of molybdenum (Mo), molybdenum niobium alloy (MoNb), aluminum (Al), aluminum neodymium alloy (AlNd), titanium (Ti) and copper (Cu), and preferably a mono-layered structure or a multi-layered composite lamination structure consisting of Mo, Al or alloy containing Mo, Al.

step 2, on the base 1 subjected to the above step, forming a gate insulation layer 3 by using a preparing method such as thermal growth, atmospheric pressure chemical vapor deposition, low pressure chemical vapor deposition, plasma-assisted chemical vapor deposition, sputtering.

The gate insulation layer 3 may be a multi-layered composite layer made of one or more of silicon oxide (SiOx), silicon nitride (SiNx), hafnium oxide (HfOx), silicon nitrogen oxide (SiON) and aluminum oxide (AlOx).

Step 3, on the base 1 subjected to the above steps, depositing a semiconductor active layer film of a thin film transistor through spraying, vacuum evaporation, sol-gel or magnetron sputtering, and then forming a pattern including an active layer 4 of the thin film transistor through a patterning process.

Step 4, on the base 1 subjected to the above steps, forming a source-drain metal layer film, and forming a pattern including a source 5-1 and a drain 5-2 of the thin film transistor, a data line 10 and a common electrode line 12 through a patterning process simultaneously, so that the source 5-1 and the drain 5-2 are in contact with the active layer 4 through source and drain contact regions, respectively, the data line 10 is connected to the source 5-1, and the common electrode line 12 and the data line 10 are provided in parallel.

The source-drain metal layer film may be made of one or more of molybdenum (Mo), molybdenum niobium alloy (MoNb), aluminum (Al), aluminum neodymium alloy (AlNd), titanium (Ti) and copper (Cu), and Mo, Al or alloy containing Mo, Al are preferable.

Step 5, on the base 1 subjected to the above steps, forming a first transparent conductive thin film by using magnetron sputtering or thermal evaporation method, and forming a pattern including a first resistance wire layer 9 and a pixel electrode 6 by a single patterning process, so that the first resistance wire layer 9 and the pixel electrode 6 are spaced apart from each other.

The first transparent conductive thin film may be made of indium tin oxide (ITO), indium zinc oxide (IZO) or aluminum zinc oxide etc.

Step 6, on the base 1 subjected to the above steps, forming an insulation layer 7 by using a preparing method such as thermal growth, atmospheric pressure chemical vapor deposition, low pressure chemical vapor deposition, plasma-assisted chemical vapor deposition, sputtering.

The insulation layer 7 may be a multi-layered composite layer made of one or more of silicon oxide (SiOx), silicon nitride (SiNx), hafnium oxide (HfOx), silicon nitrogen oxide (SiON) and aluminum oxide (AlOx).

Step 7, on the base 1 subjected to the above steps, performing an etching process so as to form a via hole penetrating through the insulation layer 7 and the first resistance wire layer 9.

Step 8, forming a second transparent conductive thin film by using megnetron sputtering or thermal evaporation method, forming a pattern including a common electrode 8 and a second resistance wire layer 11 by a patterning process, wherein the second resistance wire layer 11 is connected to the common electrode line 12 through the via hole, and the second resistance wire layer 11 is connected to the common electrode 8.

The second transparent conductive thin film and the first transparent conductive thin film are formed of the same material.

In the manufacturing method of the array substrate in this embodiment, the resistance of the common electrode line 12 is decreased and no additional process step is added.

Third Embodiment

This embodiment provides a display device, comprising the array substrate of the first embodiment, and the display device may be any product or component with display function, such as a mobile phone, a tablet computer, a TV, a display, a notebook computer, a digital image frame, a navigator etc.

The display device of this embodiment has the array substrate of the first embodiment, and therefore, it has better performance.

Certainly, the display device of this embodiment may also comprise other conventional structures, such as a power supply unit, a driving unit and the like.

It can be understood that, the foregoing implementations are merely exemplary implementations used for explaining the principle of the present invention, but the present invention is not limited thereto. Those of ordinary skill in the art may make various variations and improvements without departing from the spirit and essence of the present invention, and these variations and improvements also fall within the protection scope of the present invention.

The invention claimed is:

1. An array substrate comprising a pixel electrode, a common electrode provided above the pixel electrode, and a common electrode line electrically connected to the common electrode, wherein the pixel electrode and the common electrode are insulated from each other, and wherein the array substrate further comprises a first resistance wire layer, and a second resistance wire layer which is provided above the first resistance wire layer and is insulated from the first resistance wire layer,
the first resistance wire layer is provided on and in contact with the common electrode line; and
the second resistance wire layer is electrically connected to the common electrode line through a via hole penetrating through the first resistance wire layer and an insulation layer provided between the first resistance wire layer and the second resistance wire layer.

2. The array substrate of claim 1, wherein the first resistance wire layer and the pixel electrode are provided in the same layer, spaced apart from each other, and made of the same material.

3. The array substrate of claim 1, wherein the second resistance wire layer and the common electrode are provided in the same layer and made of the same material, and wherein the second resistance wire layer is electrically connected to the common electrode.

4. The array substrate of claim 2, wherein the second resistance wire layer and the common electrode are provided in the same layer and made of the same material, and wherein the second resistance wire layer is electrically connected to the common electrode.

5. The array substrate of claim 1, further comprising a thin film transistor, wherein a source and a drain of the thin film transistor and the data line are provided in the same layer, and the data line is connected to the source, and the data line and the common electrode line are provided in the same layer to be parallel to each other.

6. The array substrate of claim 5, wherein the source and the drain of the thin film transistor, the data line and the common electrode line are made of the same material.

7. A manufacturing method of an array substrate, wherein the array substrate is the array substrate of claim 1, the manufacturing method comprising:
forming a pattern including a common electrode line on a base through a patterning process;
forming a pattern including a first resistance wire layer in contact with the common electrode line on the base subjected to the above step through a patterning process;
forming an insulation layer on the base subjected to the above step;
forming a via hole penetrating through the insulation layer and the first resistance wire layer on the base subjected to the above step through a patterning process; and
forming a pattern including a second resistance wire layer on the base subjected to the above step through a patterning process, so that the second resistance wire layer is connected to the common electrode line through the via hole.

8. The manufacturing method of claim 7, further comprising a step of forming a pattern including a pixel electrode while forming the pattern including the first resistance wire layer in contact with the common electrode line, wherein the pixel electrode and the first resistance wire layer are spaced apart from each other.

9. The manufacturing method of claim 7, further comprising a step of forming a pattern including a common electrode while forming the pattern including the second resistance wire layer, wherein the common electrode is connected to the second resistance wire layer.

10. The manufacturing method of claim 8, further comprising a step of forming a pattern including a common electrode while forming the pattern including the second resistance wire layer, wherein the common electrode is connected to the second resistance wire layer.

11. The manufacturing method of claim 7, further comprising a step of forming a source and a drain of a thin film transistor and a data line while forming the pattern including the common electrode line on the base through the patterning process, wherein the data line is connected to the source, and the data line is parallel to the common electrode line.

12. A display device comprising the array substrate of claim 1.

* * * * *